US011421861B2

(12) United States Patent
Hatano

(10) Patent No.: US 11,421,861 B2
(45) Date of Patent: Aug. 23, 2022

(54) LIGHT SOURCE MODULE

(71) Applicant: NICHIA CORPORATION, Anan (JP)

(72) Inventor: Tomohiko Hatano, Anan (JP)

(73) Assignee: NICHIA CORPORATION, Anan (JP)

( * ) Notice: Subject to any disclaimer, the term of this patent is extended or adjusted under 35 U.S.C. 154(b) by 283 days.

(21) Appl. No.: 16/882,530

(22) Filed: May 24, 2020

(65) Prior Publication Data

US 2020/0370733 A1  Nov. 26, 2020

(30) Foreign Application Priority Data

May 24, 2019  (JP) .............................. JP2019-098102

(51) Int. Cl.
| F21V 19/00 | (2006.01) |
| F21V 23/04 | (2006.01) |
| H01L 25/075 | (2006.01) |
| H01R 12/72 | (2011.01) |
| H01L 33/50 | (2010.01) |
| H01L 33/62 | (2010.01) |
| H01L 33/48 | (2010.01) |
| H01L 33/00 | (2010.01) |

(52) U.S. Cl.
CPC ........ F21V 19/002 (2013.01); F21V 23/0457 (2013.01); H01L 25/0753 (2013.01); H01L 33/00 (2013.01); H01L 33/486 (2013.01); H01L 33/502 (2013.01); H01L 33/62 (2013.01); H01R 12/724 (2013.01); H05K 2201/00 (2013.01); H05K 2201/09727 (2013.01); H05K 2201/10424 (2013.01)

(58) Field of Classification Search
CPC ............... F21V 19/002; F21V 23/0457; H01L 25/0753; H01L 33/00; H01L 33/486; H01L 33/502; H01L 33/62; H01R 12/724; H05K 2201/00; H05K 2201/09727; H05K 2201/0424

See application file for complete search history.

(56) References Cited

U.S. PATENT DOCUMENTS

| 7,750,458 B2 * | 7/2010 | Takeda .................. F21S 41/148 257/692 |
| 2007/0206369 A1 | 9/2007 | Takeda et al. |
| 2016/0336500 A1 * | 11/2016 | Cai ..................... H01L 33/0095 |

FOREIGN PATENT DOCUMENTS

| JP | 2007-242267 | 9/2007 |
| JP | 2013-219289 | 10/2013 |

* cited by examiner

*Primary Examiner* — Mary Ellen Bowman
(74) *Attorney, Agent, or Firm* — Mori & Ward, LLP

(57) ABSTRACT

A light source module includes a light-emitting device having an upper surface and a lower surface and including: at least one light-emitting element and a plurality of conductive regions on the upper surface of the light-emitting device; a mounting substrate having an upper surface on which a lower surface side of the light-emitting device is located, the mounting substrate including conductive patterns on the upper surface of the mounting substrate, each conductive pattern including a device-side connecting portion and an external side connecting portion; and a plurality of conductive members each having a first end bonded to a respective one of the device-side connecting portion and a second end opposite to the first end, the second end being in contact with a respective one of the conductive region by elasticity to electrically connect the respective one of the conductive regions and a respective one of the conductive patterns.

9 Claims, 14 Drawing Sheets

LIGHT SOURCE MODULE

CROSS-REFERENCE TO RELATED APPLICATIONS

The present application claims priority under 35 U.S.C. § 119 to Japanese Patent Application No. 2019-098102, filed May 24, 2019. The contents of this application are incorporated herein by reference in their entirety.

BACKGROUND

1. Field of the Invention

The present invention relates to a light source module.

2. Description of Related Art

Light-emitting elements such as light-emitting diodes and semiconductor lasers can be employed for, for example, vehicle headlights. A light source module used in a lighting device for a vehicle is described in, for example, JP2007-242267A. The light source module described in JP2007-242267A includes a semiconductor light-emitting element, a circuit board on which a conductive pattern for electrical connection to the semiconductor light-emitting element is formed, and an attachment for power feeding connected to an external power source.

The light source module in JP2007-242267A employs the attachment for power feeding in which a socket for connection to the external power source and a power feeding terminal for connection of the light-emitting element are integrally formed, and the power feeding terminal and the conductive pattern of the circuit board are fixed together to establish electrical connection.

The number and arrangement of terminals required for supplying power may vary according to a structure of the light source module.

There is still room for improvement to obtain a light source module that can flexibly correspond to designs of the number, arrangement, etc., of terminals required for supplying power.

SUMMARY OF THE INVENTION

A light source module according to one aspect of the present invention includes a light-emitting device having an upper surface and a lower surface and including: at least one light-emitting element and a plurality of conductive regions on the upper surface of the light-emitting device; a mounting substrate having an upper surface on which a lower surface side of the light-emitting device is located, the mounting substrate including a plurality of conductive patterns on the upper surface of the mounting substrate, each of the plurality of conductive patterns including a device-side connecting portion and an external side connecting portion; and a plurality of conductive members, each of the plurality of conductive members having a first end bonded to a respective one of the device-side connecting portion and a second end opposite to the first end, the second end being in contact with a respective one of the conductive region by elasticity to electrically connect the respective one of the conductive regions and a respective one of the conductive patterns.

The structure described above allows for obtaining a light source module that can flexibly correspond to designs of the number, arrangement, etc., of terminals required for supplying power.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
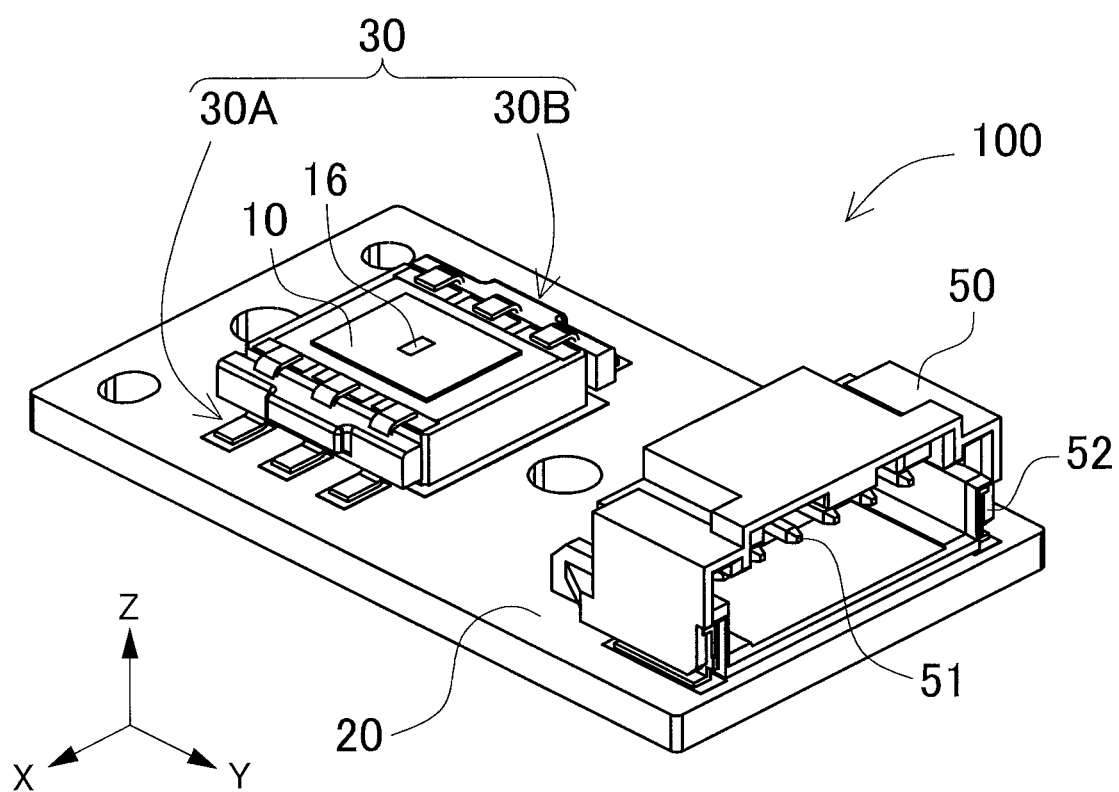
FIG. 1 is a schematic perspective view of a light source module according to a first embodiment.

The embodiments of the present invention may be utilized by the following various configurations.

A light source module according to an embodiment of the present invention includes a light-emitting device having an upper surface and a lower surface and including: at least one light-emitting element and a plurality of conductive regions on the upper surface of the light-emitting device; a mounting substrate having an upper surface on which a lower surface side of the light-emitting device is located, the mounting substrate including a plurality of conductive patterns on the upper surface of the mounting substrate, each of the plurality of conductive patterns including a device-side connecting portion and an external side connecting portion; and a plurality of conductive members, each of the plurality of conductive members having a first end bonded to a respective one of the device-side connecting portion and a second end opposite to the first end, the second end being in contact with a respective one of the conductive region by elasticity to electrically connect the respective one of the conductive regions and a respective one of the conductive patterns.

A light source module according to a further embodiment of the present invention can further include a conductive member holder integrally holding two or more conductive members of the plurality of conductive members.

In a light source module according to another embodiment of the present invention, in addition to the above structure, the conductive member holder can include a first lateral surface facing the light-emitting device, a second lateral surface opposite to the first lateral surface, and a protrusion on the second lateral surface opposite to the first lateral surface.

In a light source module according to still another embodiment of the present invention, in addition to any of the above structures, the plurality of conductive patterns can include at least one first conductive pattern and at least one second conductive pattern, the light-emitting device can have a first lateral surface and a second lateral surface opposite to the first lateral surface, the plurality of conductive regions can include at least one first conductive region disposed at a first lateral surface side of the light-emitting device and at least one second conductive region disposed at a second lateral surface side of the light-emitting device, and the plurality of conductive members can include at least one first conductive member facing the first lateral surface and electrically connecting a respective one of the at least one first conductive region and a respective one of the at least one first conductive pattern, and at least one second conductive member facing the second lateral surface and electrically connecting a respective one of the at least one second conductive region and a respective one of the at least one second conductive pattern.

In a light source module according to still another embodiment of the present invention, in addition to any of the above structures, the at least one first conductive member can include a plurality of first conductive members, the at least one first conductive region can include a plurality of first conductive regions, the at least one first conductive pattern can include a plurality of first conductive patterns, each of the first conductive members can electrically connect a respective one of the first conductive regions and a respective one of the first conductive patterns, the at least one second conductive member can include a plurality of second conductive members, the at least one second conductive region may include a plurality of second conductive regions, the at least one second conductive pattern can include a plurality of second conductive patterns, and each of the second conductive members can electrically connect a respective one of the second conductive regions and a respective one of the second conductive patterns.

In a light source module according to still another embodiment of the present invention, in addition to any of the above structures, the plurality of first conductive patterns and the plurality of second conductive patterns can constitute a plurality of conductive pairs each consisting of a respective one of the first conductive patterns and a respective one of the second conductive patterns, the plurality of conductive pairs can include a first conductive pair and a second conductive pair, the second conductive pair including the device-side connecting portion farther from the external side connecting portion than the device-side connecting portion included in the first conductive pair, each of the first conductive patterns of the second conductive pair can pass through a gap between a respective one of the first conductive patterns of the first conductive pair and the light-emitting device, and each of the second conductive patterns of the second conductive pair can pass through a gap between a respective one of the second conductive patterns of the first conductive pair and the light-emitting device.

In a light source module according to still another embodiment of the present invention, in addition to any of the above structures, an area of the first and second conductive patterns of the first conductive pair can be larger than an area of the first and second conductive patterns of the second conductive pair.

A light source module according to still another embodiment of the present invention can further include, in addition to any of the above structures, a connector connected to the external side connecting portions of the conductive patterns.

In a light source module according to still another embodiment of the present invention, in addition to any of the above structures, the first end of each of the plurality of conductive members can be fixed to the device-side connecting portion by soldering.

Certain embodiments of the present invention will be described below in detail on the basis of the accompanying drawings. The descriptions below include terms indicating specific directions or positions (such as "up", "down", and other terms containing these terms) as appropriate. These terms are used to facilitate understanding of the present invention referring to the drawings, and the meanings of these terms do not limit the technical scope of the present invention. A portion with the same reference numeral in a plurality of drawings represents the same or equivalent portion or member. The term "include" in the present specification is used to indicate both of inclusion as a separate member and inclusion as an integrated member.

In the embodiments described below, examples of light-emitting modules are described to give concrete form to the technical idea of the present invention, and the present invention is not limited to the description below. Unless otherwise specified, sizes, materials, shapes, and relative positions of constituent components described below are not intended to limit the scope of the present invention thereto, but rather are described as examples. Constitutions described in one embodiment may be applicable to other embodiments. Sizes or positional relationships of components illustrated in the drawings may be exaggerated in order to clarify the descriptions.

First Embodiment

Figure 2:
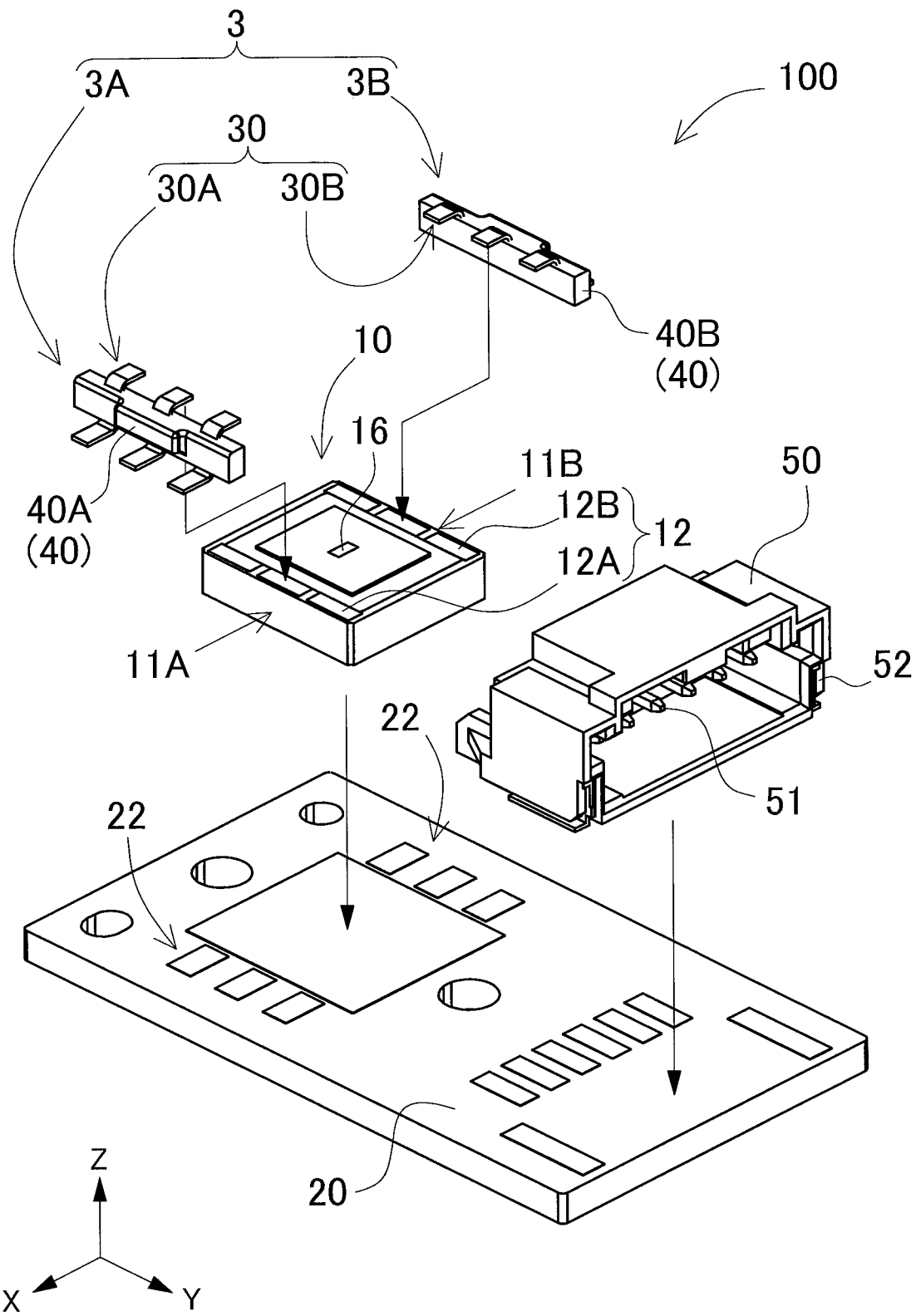
FIG. 2 is a schematic exploded perspective view of the light source module in FIG. 1.
Figure 3:
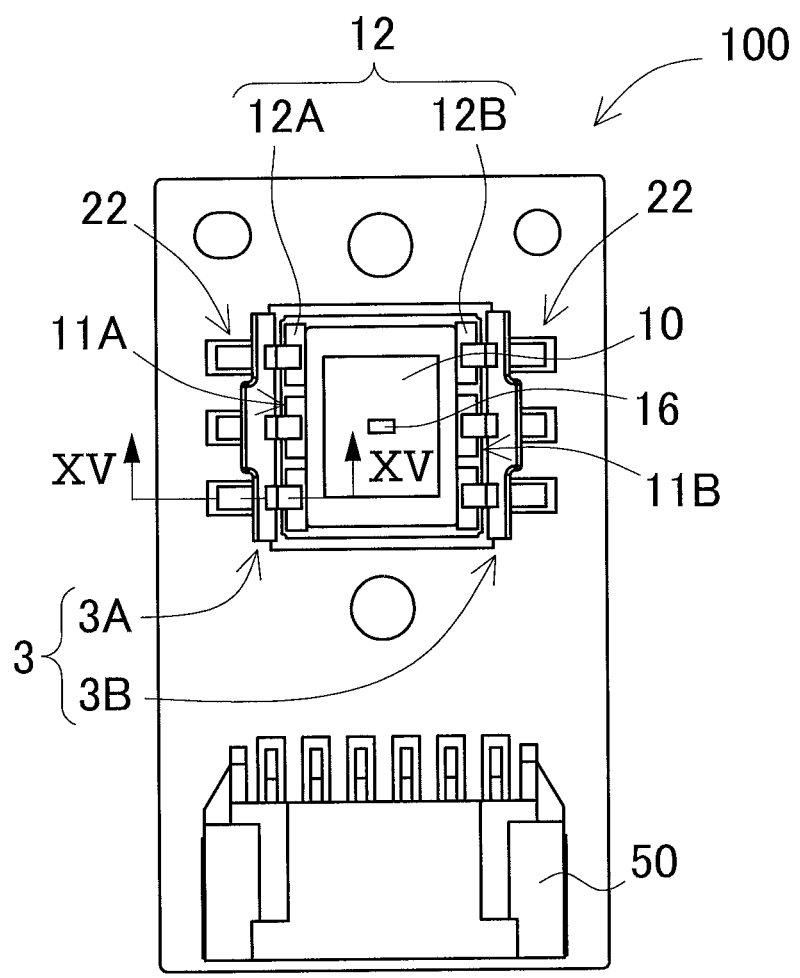
FIG. 3 is a schematic plan view of the light source module in FIG. 1.

FIG. 1, FIG. 2, and FIG. 3 are respectively a schematic perspective view, a schematic exploded perspective view, and a schematic plan view of a light source module according to a first embodiment. A light source module 100 shown in FIGS. 1 to 3 includes a light-emitting device 10 containing at least one light-emitting element, a connector 50, a mounting substrate 20 having an upper surface on which the light-emitting device 10 and the connector 50 are mounted, and a pair of conductive members 30 electrically connecting the light-emitting device 10 and the mounting substrate 20.

Light-Emitting Device 10

Figure 4:
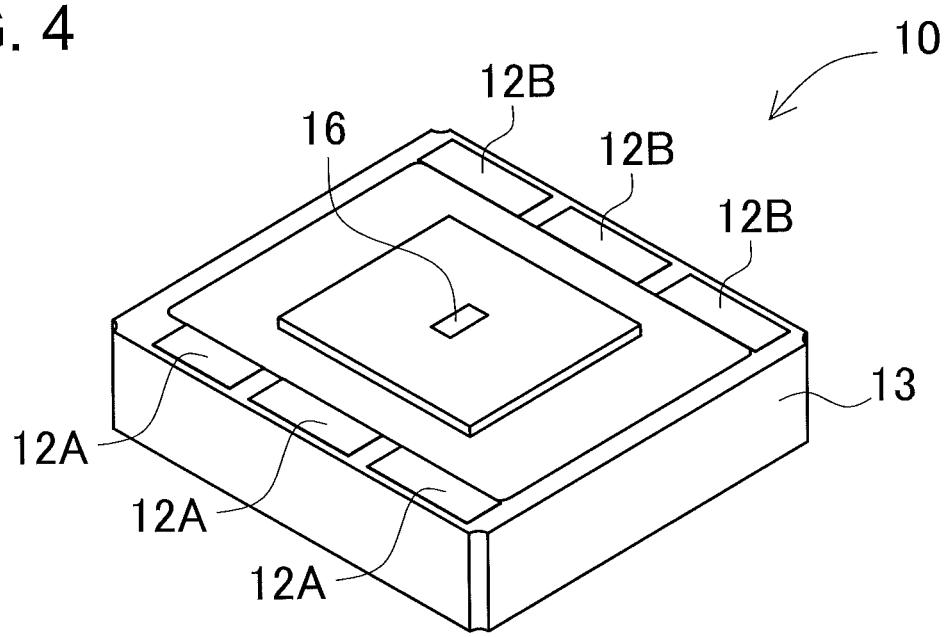
FIG. 4 is a schematic perspective view of a light-emitting device in FIG. 2.
Figure 5:
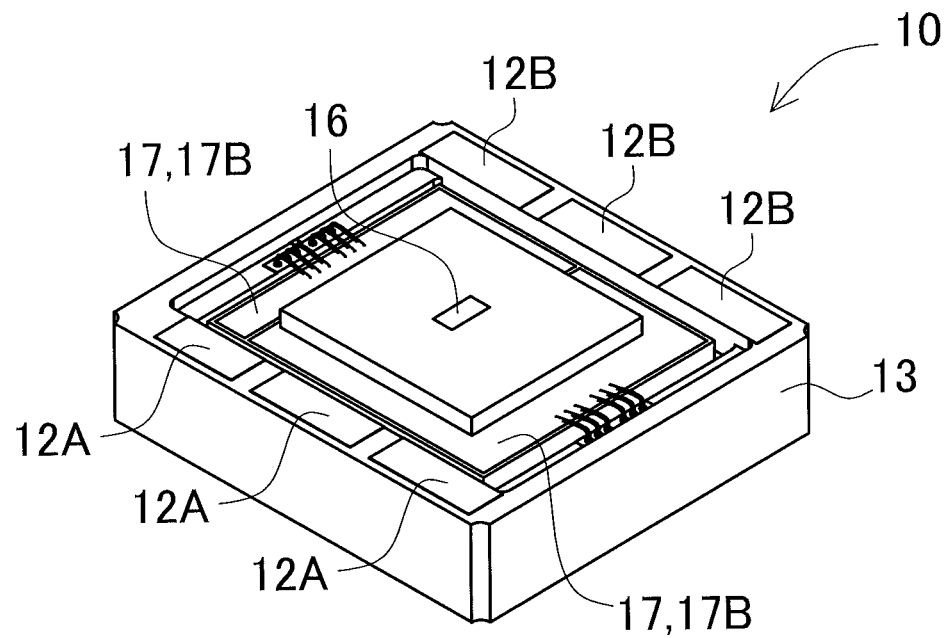
FIG. 5 is a schematic perspective view of the internal construction of the light-emitting device.
Figure 6:
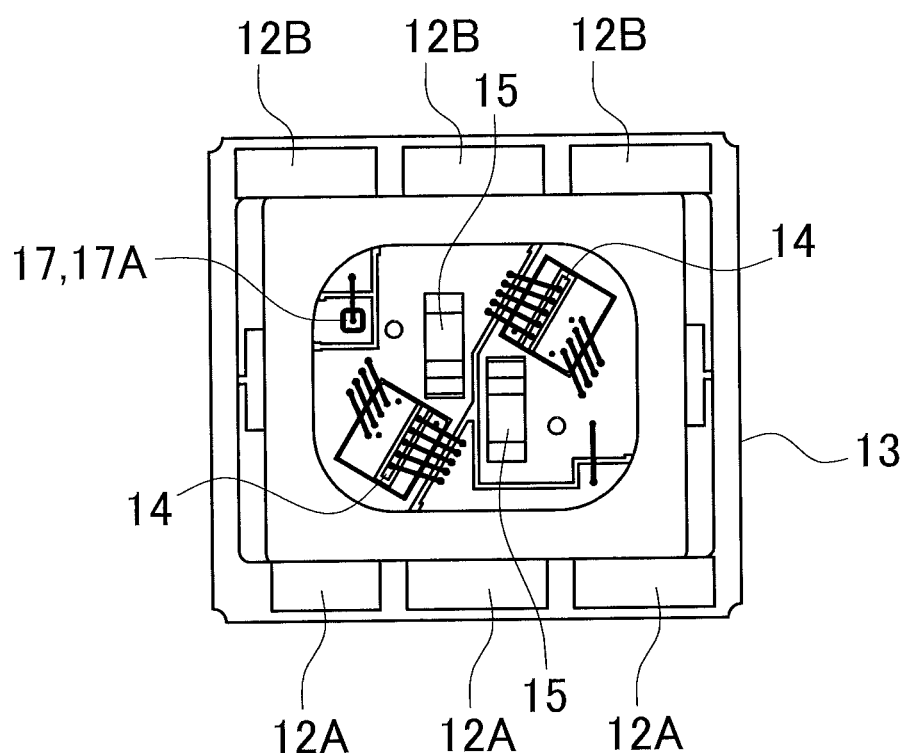
FIG. 6 is a schematic plan view of the internal construction of the light-emitting device.

FIG. 4 is a schematic perspective view of the light-emitting device 10, FIG. 5 is a schematic perspective view of the internal construction of the light-emitting device 10, and FIG. 6 is a schematic plan view of the internal construction of the light-emitting device 10. In FIG. 5 and FIG. 6, illustration of a portion of components constituting a package 13 is omitted. Light-emitting elements 14 are hermetically sealed in FIG. 5, and the light-emitting elements 14 are not hermetically sealed in FIG. 6. The light-emitting device 10 includes the package 13, at least one light-emitting element 14, and at least one state detecting member 17. The light-emitting device 10 also includes a wavelength conversion member 16. The package 13 defines a shape of an outer periphery of the light-emitting device 10. The light-emitting elements 14 are arranged inside the outer periphery of the package 13. The at least one light-emitting element 14 is located in a hermetically sealed space inside the package 13. After the light-emitting element 14 is disposed in an open space, the space is closed with a cover. Accordingly, the package 13 is constituted of a plurality of members. Light emitted from the at least one light-emitting element 14 is incident on the wavelength conversion member 16. In FIG. 6, light emitted from the light-emitting elements 14 is reflected by light-reflective members 15. The reflected light is incident on the wavelength conversion member 16. A light-emitting device can have a structure that allows light to be incident on the wavelength conversion member 16 without the light-reflective members. The wavelength conversion member 16 is adapted to emit light having a wavelength different from a wavelength of the incident light. Light emitted from the light-emitting elements 14 and the wavelength-converted light are emitted to the outside from the light-emitting device. Accordingly, the package 13 has a region from which light is extracted. In the light-emitting device 10, the upper surface of the wavelength conversion member 16 serves as a light extraction region of the package 13. The state detecting members 17 are elements configured to detect the operating state of the light-emitting device 10. The light-emitting device 10 includes, as the state detecting members 17, a first state detecting member 17A configured to detect the operating state of the light-emitting elements 14, and a second state detecting member 17B configured to detect the operating state of the wavelength conversion member 16. For example, an element, such as a thermistor, configured to measure temperature is used for the first state detecting member 17A because an excessively high temperature of the light-emitting elements 14 can interfere with the proper operation of the light-emitting elements 14. Also, for example, an element configured to detect an abnormality, such as breakage and exfoliation, of the wavelength conversion member 16 is used for the second state detecting member 17B because detachment of the wavelength conversion member 16 can prevent appropriate light emission. In FIG. 5, a protective member that protects the second state detecting member 17B to prevent the second state detecting member 17B from being exposed, which is a portion of components constituting the package 13 and is omitted. In FIG. 6, a cover, which is a portion of components constituting the package 13 and is also omitted, that hermetically seals the space in which the light-emitting elements 14 and the first state detecting member 17A are arranged.

A plurality of conductive regions 12 are located on the upper surface of the light-emitting device 10. The plurality of conductive regions 12 include a pair of conductive regions 12 for electrically connecting at least one light-emitting element 14 to an external device and another pair of conductive regions 12 for electrically connecting each state detecting member 17 to an external device. One of the pair of conductive regions is referred as a first conductive region, the other one of the pair of conductive regions is referred as a second conductive region. On the upper surface of the light-emitting device 10, the first conductive regions 12A are located at a first lateral surface 11A of the light-emitting device 10, and the second conductive regions 12B are located at a second lateral surface 11B opposite to the first lateral surface 11A. Further, on the upper surface of the light-emitting device 10, three first conductive regions 12A are located at the first lateral surface 11A and three second conductive regions 12B are located at the second lateral surface 11B. The upper surface and the lateral surfaces of the light-emitting device 10 also serves as the upper surface and the lateral surfaces of the package 13.

Semiconductor light-emitting elements such as semiconductor laser elements can be used for the light-emitting elements 14. The semiconductor light-emitting elements preferably contain a nitride semiconductor ($In_XAl_YGa_{1-X-Y}N$, where $0 \leq X$, $0 \leq Y$, and $X+Y \leq 1$), which is adapted to emit light with a short wavelength that can efficiently excite the wavelength conversion material. The wavelength conversion member 16 can contain a phosphor. Examples of the phosphor include cerium-activated yttrium-aluminum-garnet, cerium-activated lutetium-aluminum-garnet, europium- and/or chromium-activated nitrogen-containing calcium aluminosilicate (calcium can be partially substituted with strontium), europium-activated SiAlON, europium-activated silicate, europium-activated strontium aluminate, β-SiAlON phosphors, nitride phosphors, sulfide phosphors, quantum-dot phosphors, and fluoride phosphors such as KSF phosphors.

Mounting Substrate 20

Figure 7:
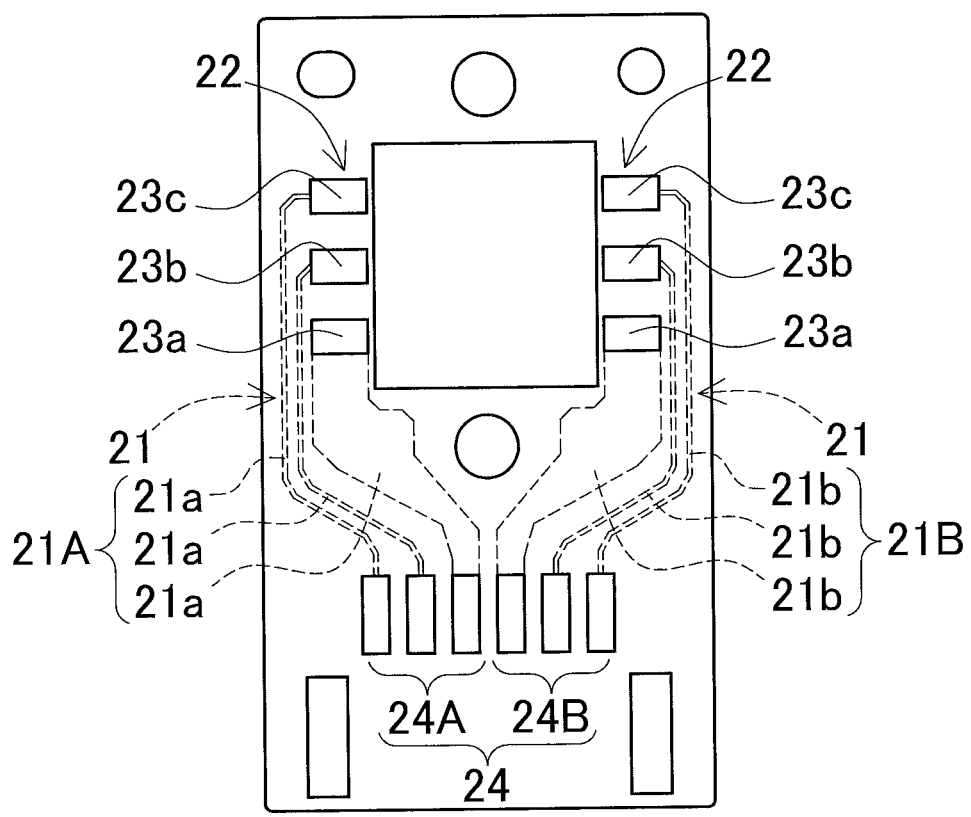
FIG. 7 is a schematic plan view of conductive patterns of a mounting substrate according to the first embodiment.

The light-emitting device 10 is mounted on the mounting substrate 20 such that the lower surface of the light-emitting device 10 faces the upper surface of the mounting substrate 20. A plurality of conductive patterns 21 are disposed on the upper surface of the mounting substrate 20. The conductive patterns 21 include device-side connecting portions 22 and external-side connecting portions 24. FIG. 7 shows the conductive patterns 21 of the mounting substrate 20. The solid lines indicate exposed portions of the conductive patterns 21, and the dashed lines indicate unexposed portions of the conductive patterns 21. For example, unexposed portions of the conductive patterns are covered with an insulating film. Accordingly, the unexposed portions are portions that may not be electrically connected even when brought into contact with an external device. The conductive patterns 21 include a group 21A of first conductive patterns and a group 21B of second conductive patterns. The group 21A of first conductive patterns includes three first conductive patterns 21a, and the group 21B of second conductive patterns includes three second conductive patterns 21b. Each of the conductive patterns 21 has a first end and a second end opposite to the first end, and includes a device-side connecting portion 22 at the first end and an external side connecting portion 24 at the second end. The electrical connection is established by each pair of the first conductive pattern 21*a* and the second conductive pattern 21*b*. Accordingly, the mounting substrate 20 includes a first conductive pair 23*a*, a second conductive pair 23*b*, and a third conductive pair 23*c* in the order from the external side connecting portions 24 side, each of the first to third conductive pairs 23*a* to 23*c* consisting of a pair of a respective first conductive pattern 21*a* and a respective second conductive pattern 21*b*. In each of the group 21A of first conductive patterns and the group 21B of second conductive patterns, the conductive pattern 21 of the second conductive pair 23*b* passes outside the conductive pattern 21 of the first conductive pair 23*a*, and the conductive pattern 21 of the third conductive pair 23*c* passes outside the conductive pattern 21 of the second conductive pair 23*b*. In each of the group 21A of first conductive patterns and the group 21B of second conductive patterns, an unexposed portion of the conductive pattern 21 of the second conductive pair 23*b* and the conductive pattern 21 of the third conductive pair 23*c* are located outside the device-side connecting portion 22 of the conductive pattern 21 of the first conductive pair 23*a*, and the unexposed portion of the conductive pattern 21 of the third conductive pair 23*c* is located outside the device-side connecting portion 22 of the conductive pattern 21 of the second conductive pair 23*b*.

Connector 50

The connector 50 constitutes an interface for connecting the light source module 100 to an external device. The connector 50 is disposed on first external side connecting portions 24A, which are the external side connecting portions 24 of the group 21A of first conductive patterns, and on second external side connecting portions 24B, which are the external side connecting portions 24 of the group 21B of second conductive patterns, and is electrically connected to the external side connecting portions 24. In the example shown in FIG. 1 and FIG. 2, a frame 52 made of an insulating member such as a resin surrounds pins 51 for electrical connection to an external device to protect the pins 51.

Conductive Members 30

The conductive members 30 electrically connect the conductive regions 12 and the conductive patterns 21. Each of the conductive members 30 has a first end bonded to the device-side connecting portion 22, and a second end opposite to the first end and in contact with the conductive region 12 by elasticity. The term "contact" includes not only the state where the contact is established by bonding with an adhesive or the like but also the state where the contact is established using an external force such as pressure or gravity. The expression "in contact by elasticity" indicates that the contact is established by only the effect of elasticity without an adhesive or the like. On the other hand, the case where the contact is established by not only the effect of elasticity but also another effect such as the effect of bonding with an adhesive is described as "in contact while retaining elasticity". With the structure in which the conductive members 30 electrically connect the light-emitting device 10 to the mounting substrate 20, the structure of the light source module can be easily adapted to a change in configuration or the like. That is, with a structure constituting separate parts, which indicates that the light-emitting device 10 is connected to the mounting board 20 by the conductive members 30 instead of a conventional holder integrated with a connector, even when changing configuration of dimensions, layout, etc., of the light-emitting device, partially changing corresponding one or more parts among the light-emitting device 10, the mounting board 20, and the conductive members 30 allows for adapting the structure of the light source module to the change in configuration of the light-emitting device 10. Allowing respective change of components instead of reconfiguring an entirety of the holder allows more flexible adaptation to change in configuration.

In addition, with the conductive members 30 each having elasticity at the second end thereof, the conductive members 30 can be elastically deformed in the height direction, which allows for accommodating difference between a height of the conductive members 30 each having the first end fixed to the mounting substrate 20 and a height of the light-emitting device 10 also mounted on the mounting substrate 20. For example, manufacturing tolerances of members when the light-emitting device is assembled can be accommodated. Also, stress concentration at bonding portions between the conductive members 30 and the conductive regions 12 caused by vibration or impact during use of the light-emitting device can be reduced. Contact with the conductive regions 12 by elasticity allows for preventing from experiencing stress, caused by vibration or impact, from both of the light-emitting device and the mounting substrate, so that the possibility that the conductive members 30 can be detached or fall off can be reduced. In the light source module 100, contact of the conductive members 30 with the light-emitting device 10 are not established except the contact by elasticity. The light source module preferably has such a structure in view of the above.

Conductive Member Holder 40

The light source module 100 preferably includes conductive member holders 40 each holding corresponding ones of the plurality of conductive members 30. Each conductive member holder 40 integrally holds corresponding ones of the plurality of conductive members 30 to constitute an integrated conductive member 3. In the example shown in FIG. 1 to FIG. 3, integrated conductive members 3 include a first integrated conductive member 3A disposed at the first lateral surface 11A of the light-emitting device 10 and a second integrated conductive member 3B disposed at the second lateral surface 11B. Each conductive member 30 includes a first connecting portion 31 and a second connecting portion 32 each extending at a corresponding one of two opposite ends of each conductive member 30. The first connecting portion 31 and the second connecting portion 32 are not surrounded by the conductive member holder 40 but are exposed from the conductive member holder 40. Meanwhile, the conductive member 30 further includes an intermediate portion 33 between the first connecting portion 31 and the second connecting portion 32, and the intermediate portion 33 is surrounded by the conductive member holder 40 and is embedded in the conductive member holder 40. With the integrated conductive member 3 in which the conductive member holder 40 integrally holds a plurality of conductive members 30 as described above, electrical connection between the light-emitting device 10 and each conductive member 30 can be easily established. In other words, the integrated conductive members 3 (at least one pair of the integrated conductive member 3A and the integrated conductive member 3B) are disposed instead of individually mounting conductive members 30. The conductive member holders 40 are made of a material having high insulation performance and high formability. For example, a resin such as a liquid crystal polymer (LCP) resin and a polyamide resin can be employed. As shown in FIG. 1 and FIG. 2, the conductive members 30 includes bent portions continuous with the first connecting portions 31 and the second connecting portions 32, and the bent portion are preferably exposed from the conductive member holders 40.

This structure allows the conductive members 30 to easily exhibit elasticity. For example, the conductive member holders 40 are disposed to be spaced apart from the mounting substrate 20 and/or the light-emitting device 10 at the time of mounting.

In the example shown in FIG. 1 to FIG. 3, the light-emitting device 10 has a rectangular upper surface in a plan view. The first conductive regions 12A are located at one of two opposite sides of the upper surface (at the first lateral surface 11A), and the second conductive regions 12B are located at the other of the two opposite side (at the second lateral surface 11B).

The conductive members 30 include at least one first conductive member 30A and at least one second conductive member 30B. The first conductive member 30A faces the first lateral surface 11A, and electrically connects the first conductive region 12A and the first conductive pattern 21a. The second conductive member 30B faces the second lateral surface 11B, and electrically connects the second conductive region 12B and the second conductive pattern 21b. The conductive member holders 40 include a first conductive member holder 40A and a second conductive member holder 40B. The first conductive member holder 40A integrally holds the at least one first conductive member 30A. The second conductive member holder 40B integrally holds the at least one second conductive member 30B. In this state, each of the plurality of first conductive members 30A electrically connect a corresponding one of the plurality of first conductive regions 12A at a first lateral surface 11A side and a corresponding first conductive pattern 21a of the group 21A of first conductive patterns. Also, each of the plurality of second conductive members 30B electrically connect a corresponding one of the plurality of second conductive regions 12B at a second lateral surface 11B side and a corresponding second conductive pattern 21b of to the group 21B of second conductive patterns.

Integrated Conductive Member 3

Figure 8:
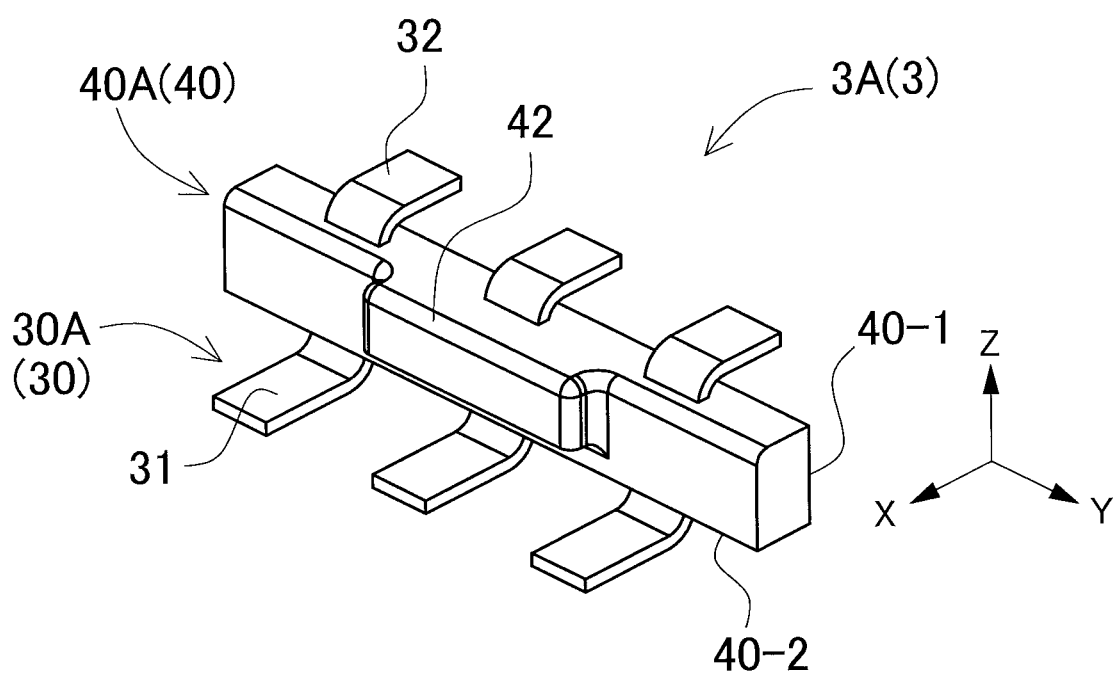
FIG. 8 is a schematic perspective view of an integrated conductive member in FIG. 2.

FIG. 8 is a schematic perspective view of the integrated conductive member 3. FIG. 8 shows the first integrated conductive member 3A in which the first conductive member holder 40A integrally holds three first conductive members 30A. The first connecting portions 31 of the first conductive members 30A protrude from of the lower surface of the first conductive member holder 40A, and the second connecting portions 32 protrude from the upper surface of the first conductive member holder 40A. Each first conductive member 30A has a first end located at a first connecting portion 31 side, and a second end opposite to the first end and located at a second connecting portion 32 side. The first connecting portions 31 protruding from the lower surface of the first conductive member holder 40A extend toward one of two opposite lateral surfaces of the first conductive member holder 40A, and the first end of each first conductive member 30A is located outward of the lateral surface of the first conductive member holder 40A toward which the first connecting portions 3 extend (the lateral surface of the first conductive member holder 40A at the first connecting portion 31 side) in a top view. The second connecting portions 32 protruding from the upper surface of the first conductive member holder 40A extend toward the other of the two opposite lateral surfaces of the first conductive member holder 40A, in other words, toward the lateral surface opposite to the lateral surface toward which the first connecting portions 31 extend, and the second end of each first conductive member 30A is located outward of the lateral surface of the first conductive member holder 40A toward which the second connecting portions 32 extend (the lateral surface of the first conductive member holder 40A at the second connecting portion 32 side) in a top view. Such a structure in which a plurality of conductive members 30 are integrated allows for facilitating operation of holding and positioning the conductive members 30 in the manufacturing of the light-emitting device. Each of the first conductive members 30A is electrically connected to the light-emitting device 10 such that the lateral surface of each first conductive member 30A toward which the second connecting portions 32 extend faces the light-emitting device 10. The first integrated conductive member 3A is disposed at the first lateral surface 11A side of the light-emitting device 10 as shown in FIG. 2. The second integrated conductive member 3B has substantially the same shape and structure as the first integrated conductive member 3A and is disposed at the second lateral surface 11B side. The integrated conductive members 3 are arranged such that the conductive member holders 40 are not brought into contact with the light-emitting device 10. With this arrangement, the effect of vibration of the light-emitting device 10 on the integrated conductive members 3 can be reduced. The conductive member holders 40 have a bar shape and hold the conductive members 30 to be spaced from each other at predetermined intervals. The intermediate portion 33 of each conductive member 30 is embedded in the conductive member holder 40.

Second Embodiment

Figure 9:
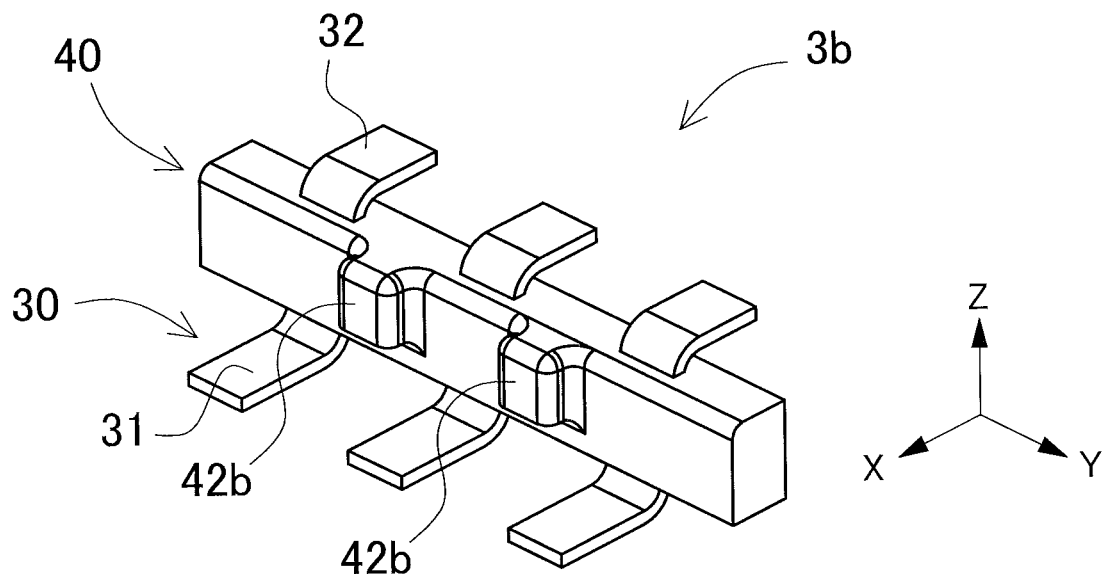
FIG. 9 is a schematic perspective view of an integrated conductive member in a light source module according to a second embodiment.

Each conductive member holder 40 can partially have a protrusion 42 protruding in a lateral direction on the lateral surface of each conductive member holder 40 at the first connecting portion 31 side. The conductive member holder 40 includes a first lateral surface 40-1 facing the light-emitting device 10, a second lateral surface 40-2 opposite to the first lateral surface 40-1, and the protrusion 42 is provided on the second lateral surface 40-2. That is, the conductive member holder 40 has a convex shape on the lateral surface of the conductive member holder 40 at the first connecting portion 31 side. This structure allows the conductive member holder 40 to be easily held using the protrusion 42 in the manufacturing. For example, when mounting the integrated conductive member, the uppermost surface (the surface of the protruding portion) of the convex shape, in other words, an outermost surface of lateral surfaces of the conductive member holder 40 at the first connecting portion 31 side, can serve as a region on which suction is performed by a mounter to pick up the integrated conductive member. In the example shown in FIG. 8, the protrusion 42 is located at the center in the direction in which the conductive member holder 40 extends. Any appropriate structure of the protrusion other than that shown in FIG. 8 can be employed. For example, each conductive member holder 40 can include a plurality of protrusions 42b as in an integrated conductive member 3b of a light source module according to a second embodiment shown in the schematic perspective view of FIG. 9. Each of the protrusions 42b is preferably located between adjacent ones of the plurality of conductive members 30 in a top view. With a structure in which the protrusions 42b do not overlap the conductive members 30 in a top view, the state of connection between the conductive members 30 and the device-side connecting portions 22 can be easily confirmed when the integrated conductive member is mounted.

Each conductive member 30 has a bent narrow-and-long plate shape and has a first end and a second end in the longitudinal direction. Each conductive member 30 includes the first connecting portion 31 connected to the device-side connecting portion 22 at the first end in the longitudinal direction, and the second connecting portion 32 connected to the conductive region 12 at the second end in the longitudinal direction. In the example shown in FIG. 8, the first connecting portion 31 continuous with the lower end of the intermediate portion 33 of each conductive member 30 is bent and extends in a single direction, and the second connecting portion 32 continuous with the upper end of the intermediate portion 33 is bent and extends in a direction different from the direction in which the first connecting portion 31 extends. The first connecting portion 31 and the second connecting portion 32 extend from the intermediate portion 33 in opposite directions.

The conductive member 30 is preferably made of a material having high conductivity and high elasticity, more preferably made by bending a metal plate instead of a thin linear member such as a wire having a small diameter. Examples of the "thin linear member" as used herein include a member having a linear shape with a diameter of 300 μm or less. A material of the conductive member 30 is selected in consideration of the strength and compatibility when brought into contact with metal plates constituting the device-side connecting portion 22 or the conductive region 12 by welding, touching, or the like. For example, aluminum, copper, or an alloy of these metals can be used.

The first connecting portions 31 are bonded to the device-side connecting portions 22 by soldering, laser welding, ultrasonic welding, or the like. Accordingly, the first connecting portions 31 preferably have a flat plate shape to increase the contact area with the device-side connecting portions 22.

While the second connecting portions 32 can be bonded to the conductive regions 12 in substantially the same manner as in the first connecting portions 31, the second connecting portions 32 are preferably brought into contact by elasticity. For example, in the case where the light source module according to the present embodiment is used as a light source for a vehicle headlight, it is considered that stress caused by vibration or impact can be applied on a bonding portion between a corresponding one of the conductive members and a corresponding one of the conductive regions. In particular, when soldering is performed to fix the conductive member and the conductive region together, connected portion cannot be deformed, so that concentration of stress may not be prevented, which can result in fatigue breakage and occurrence of cracks in solder can be caused. Accordingly, the second connecting portions 32 and the conductive regions 12 are not fixed together, and a pressing structure that allows the second connecting portions 32 to press against the conductive regions 12 is employed, instead of securing the second connecting portions 32 and the conductive regions 12 together by welding or the like. With the structure in which the second connecting portions 32 are not fixed to the conductive regions 12 as described above, position of contact between a corresponding second connecting portion 32 and a corresponding conductive region 12 changes when vibration, impact, or the like occurs, which allows for reducing stress concentration while the second connecting portions 32 is pressed against the conductive regions 12.

Pressing Structure

The pressing structure allows the second connecting portions 32 to be elastic and to be pressed against the conductive regions 12. In the example shown in FIG. 8, the second connecting portions 32 are bent portions obtained by bending tip portions of the conductive members 30, and are pressed against and brought into contact with the conductive regions 12. This allows the second connecting portions 32 to be elastic and to press the conductive regions 12. Also, elastic deformation of the pressing structure allows for accommodating manufacturing tolerances in the height direction (the Z direction in FIG. 8) when the light-emitting device is assembled.

Third Embodiment

Figure 10:
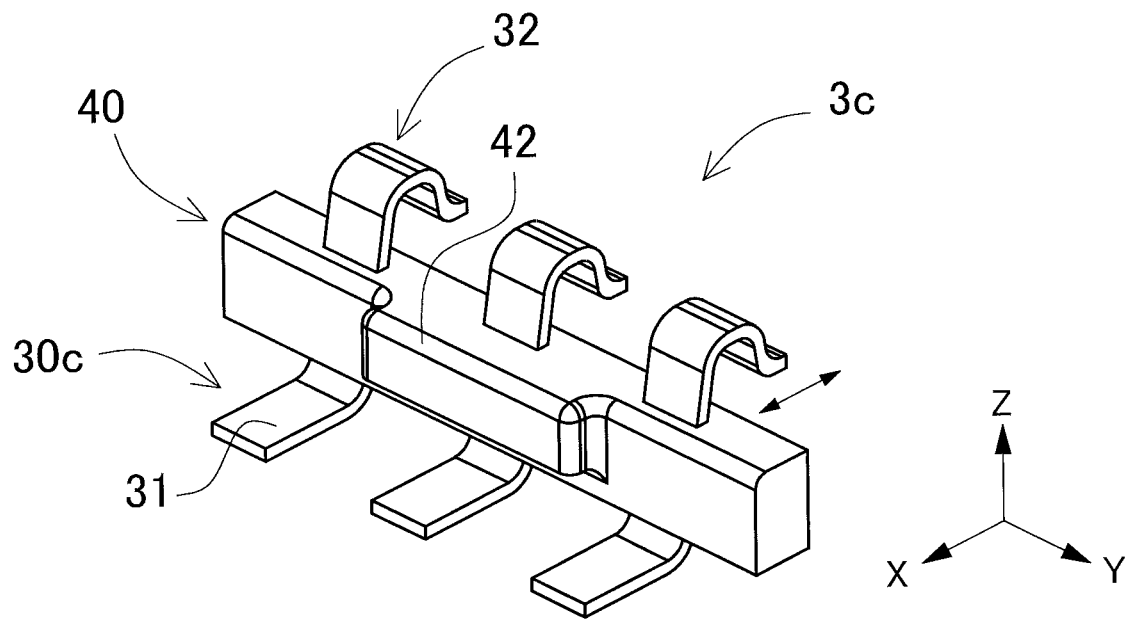
FIG. 10 is a schematic perspective view of an integrated conductive member according to a third embodiment.

The pressing structure can employ any appropriate structure that allows the second connecting portions to be pressed against the conductive regions other than a structure shown in FIG. 8. For example, in an integrated conductive member 3c used in a light source module according to a third embodiment shown in FIG. 10, each of the second connecting portions 32 extends upward from a respective one of intermediate portions 33, and is bent to extend downward to a region to be brought into contact with a respective one of the conductive regions 12 of the light-emitting device 10. The second connecting portions 32 have an inverted U-shape. With the conductive member 30 having the structure in which the second connecting portion 32 extending upward is folded downward, the pressing force applied to the upper-surface side of the light-emitting device 10 can be increased. In addition, when the U-shaped second connecting portion 32 is deformed, the tip portions of the second connecting portion 32 can be deformed in the direction indicated by the arrow (the X direction in FIG. 10) in addition to the upper-lower direction (the Z direction in FIG. 10), so that the tolerance for deformation and vibration in these directions can be improved.

Fourth Embodiment

Figure 11:
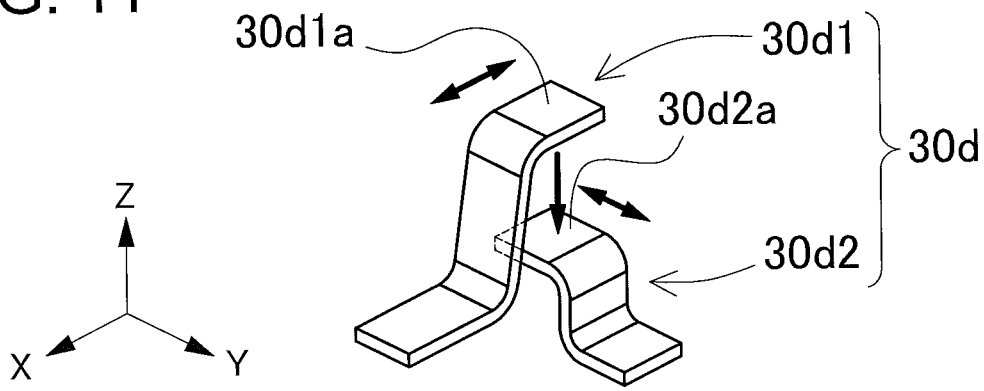
FIG. 11 is a schematic perspective view of an integrated conductive member according to a fourth embodiment.

While structures that allows for having tolerance for displacement when the relative positions of the mounting substrate 20 and the light-emitting device 10 are misaligned in a direction (the X direction in FIG. 1) orthogonal to the first lateral surface 11A and the second lateral surface 11B have been described in the examples described above, the pressing structure of the present invention can employ other appropriate configuration. For example, the pressing structure can allow for having tolerance for displacement when stress is applied further in a direction parallel to the first lateral surface 11A and the second lateral surface 11B (the Y direction in FIG. 1, that is, the longitudinal direction of the mounting substrate 20). Such an example is shown in FIG. 11, which is a schematic perspective view of an example of a pressing structure in a light source module according to a fourth embodiment. A conductive member 30d shown in this drawing is divided into a conductive member 30d1 (substrate side conductive member 30d1) at the mounting substrate 20 side and a conductive member 30d2 (device side conductive member 30d2) at the light-emitting device 10 side. The substrate side conductive member 30d1 includes a first contact portion 30d1a at a first end of the substrate side conductive member 30d1, and the device side conductive member 30d2 includes a second contact portion 30d2a at a first end of the device side conductive member 30d2. The conductive member 30d has an elastic structure in which the first contact portion 30d1a and the second contact portion 30d2a are in contact with each other to press each other. The substrate side conductive member 30d1 has a second end opposite to the first end provided with the first contact portion 30d1a, and the second end of the substrate side conductive member 30d1 is brought into contact with the conductive pattern 21. The device side conductive member 30d2 has a second end opposite to the first end provided with the second contact portion 30d2a, and the second end of the device side conductive member 30d2 is brought into contact with the conductive region 12. With this structure, if the light-emitting device is displaced relative to the mounting substrate in any of an longitudinal direction and an width direction (i.e., any of the X direction and the Y direction) as indicated by the orthogonal arrows in FIG. 11, the first contact portion 30d1a and the second contact portion 30d2a are relatively displaced to accommodate misalignment, so that stress concentration at the connecting portion between the conductive member and the conductive region 12 can be reduced. While the first contact portion 30d1a and the second contact portion 30d2a can be bonded together, the effect described above can be obtained even in the case where the first contact portion 30d1a and the second contact portion 30d2a are not bonded together. The first contact portion 30d1a and the second contact portion 30d2a are bent, and accordingly displacement in the height direction (the Z direction in FIG. 11) can be allowed according to the angles of the bent portions.

Fifth Embodiment

In the fourth embodiment described above, the conductive member 30d is constituted of two members. A conductive member 30e in a light source module according to a fifth embodiment shown in the schematic perspective view of FIG. 12 has an elastic structure in which the conductive member is constituted of a single member that can accommodate misalignment in the X direction and in the Y direction. The conductive member 30e shown in FIG. 12 includes a first connecting portion 31e located at one end of the conductive member 30e, a portion extending from the first connecting portion 31e and bent at a first bending position 35 located at an intermediate portion of the conductive member 30e to form a first surface 34, a portion extending from one of sides forming the first surface 34 and bent into a U shape at a second bending position 36 substantially orthogonal to the first bending position 35, and a peripheral end portion bent and brought into contact with the conductive region 12. In this structure, the U-shaped bent portion allows for accommodating misalignment in the Z direction and in the Y direction, and the first bending position 35 allows for accommodating misalignment in the X direction.

Sixth Embodiment

The U-shaped bent portions in the conductive member 30 can be located at other positions. For example, in an example shown in the schematic perspective view of FIG. 13, which shows a conductive member 30f in a light source module according to a sixth embodiment, the positions of the first bending position 35 and the second bending position 36 are interchanged from those in FIG. 12. That is, the conductive member 30f includes a first connecting portion 31f located at one end of the conductive member 30f, a portion extending from the first connecting portion 31f and bent into a U shape at a first bending position 35f located at an intermediate portion of the conductive member 30f to form a first surface 34f, a portion extending from one of sides forming the first surface 34f and bent at a second bending position 36f substantially orthogonal to the first bending position 35f, and a peripheral end portion bent and brought into contact with the conductive region 12. This structure allows for accommodating displacement in any of the X direction, the Y direction, and the Z direction.

Figure 12:
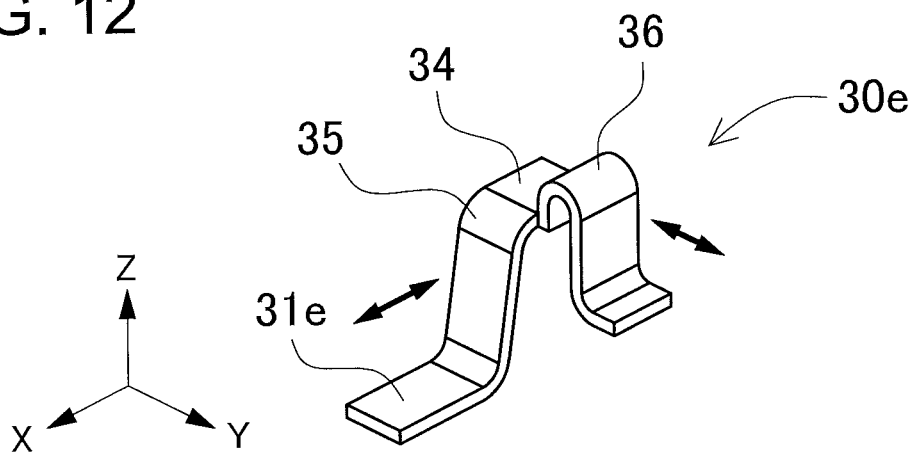
FIG. 12 is a schematic perspective view of an integrated conductive member according to a fifth embodiment.
Figure 13:
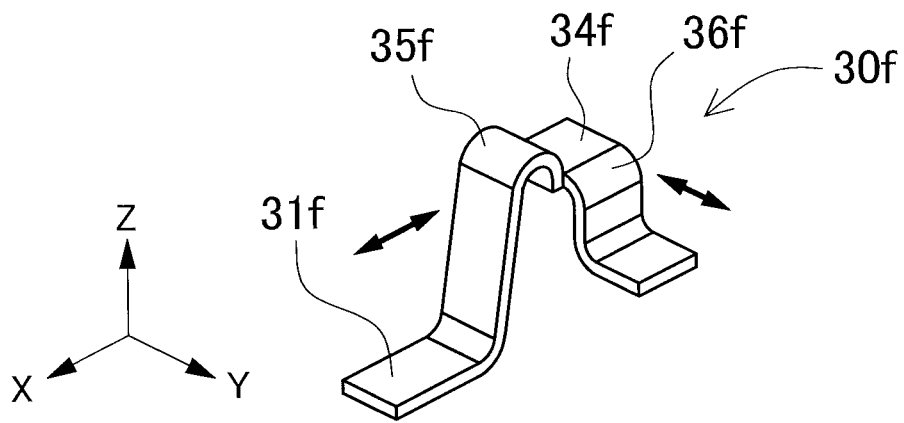
FIG. 13 is a schematic perspective view of an integrated conductive member according to a sixth embodiment.
Figure 14A:
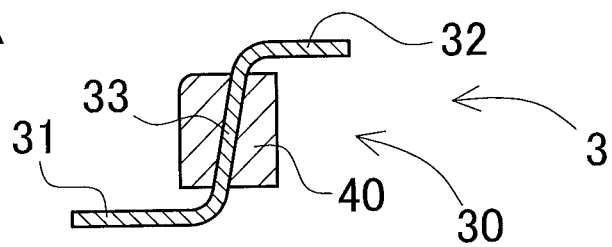
FIG. 14A is a schematic cross-sectional view of the integrated conductive member according to the first embodiment.
Figure 14B:
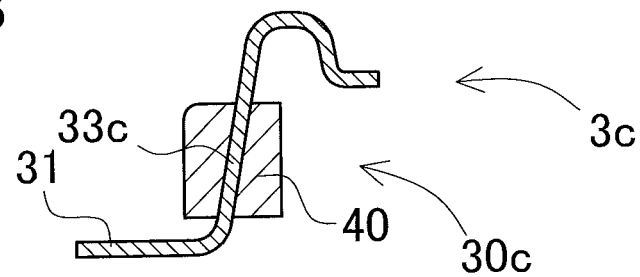
FIG. 14B is a schematic cross-sectional view of the integrated conductive member according to the third embodiment.
Figure 14C:
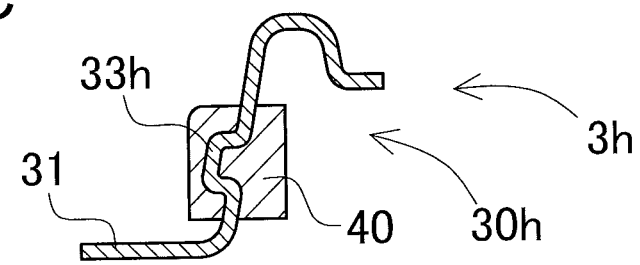
FIG. 14C is a schematic cross-sectional view of an integrated conductive member according to a seventh embodiment.

While the U-shaped bent portions protrude upward in all of the examples shown in FIG. 12 and FIG. 13 described above, the present invention is not limited to this structure. For example, a U-shaped bent portion can protrude downward. Alternatively, a U-shaped portion of the elastic structure may not protrude in the upper-lower direction, or the vertical direction, but can protrude in the horizontal direction. For example, FIG. 14E is a schematic cross-sectional view of a conductive member 30 in a light source module according to a modified example. In this conductive member 30g, a second connecting portion 32f exposed from the conductive member holder 40 is horizontally bent so as to extend in a direction away from the light-emitting device 10 and is further bent into a U shape so as to be brought into contact with the conductive region.

Seventh Embodiment

The intermediate portion of the conductive member embedded in the conductive member holder can be bent instead of having a flat-plate shape. FIG. 14A is a schematic cross-sectional view of the integrated conductive member 3 of the first embodiment, and FIG. 14B is a schematic cross-sectional view of the integrated conductive member 3c of the third embodiment. Each of the intermediate portions 33 of the conductive members 30 and 30c shown in these drawings has a flat plate shape. FIG. 14C is a schematic cross-sectional view of an integrated conductive member 3h in a light source module according to a seventh embodiment. In this example, an intermediate portion 33h is bent, and the bent intermediate portion 33h is embedded in the conductive member holder 40. With this structure, a conductive member 30h can be more firmly fixed to the conductive member holder 40.

Eighth Embodiment

Figure 14D:
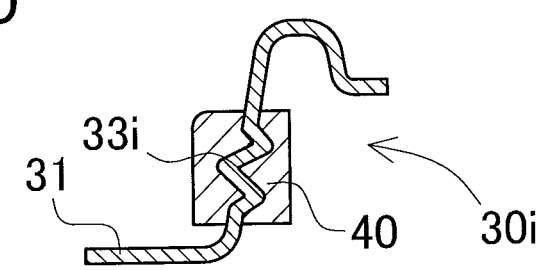
FIG. 14D is a schematic cross-sectional view of an integrated conductive member according to an eighth embodiment.
Figure 14E:
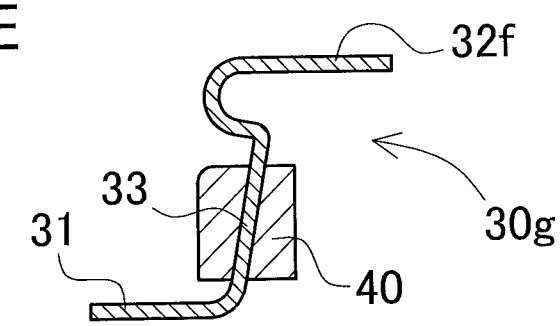
FIG. 14E is a schematic cross-sectional view of an integrated conductive member according to a modified example.

In an eighth embodiment shown in the schematic cross-sectional view of FIG. 14D, an intermediate portion 33i of a conductive member 30i is bent in a zigzag manner to further increase the contact area.

Conductive Patterns 21

The mounting substrate 20 includes a plurality of conductive patterns 21 that include the group 21A of first conductive patterns and the group 21B of second conductive patterns on an upper surface of the mounting substrate 20 as described above. In the schematic plan views of the mounting substrate 20 shown in FIG. 3 and FIG. 7, the group 21A of first conductive patterns is disposed on the left side, and the group 21B of second conductive patterns is disposed on the right side. Each first conductive pattern 21a of the group 21A of first conductive patterns and each second conductive pattern 21b of the group 21B of second conductive patterns include a corresponding one of the device-side connecting portions 22 and a corresponding one of the external side connecting portions 24. Each of the device-side connecting portions 22 is connected to a corresponding one of the first connecting portions 31 of the conductive members 30. The external side connecting portions 24 are connected to the connector 50. The device-side connecting portion 22 and the external side connecting portion 24 are located at both ends of each continuous conductive pattern 21. The conductive pattern 21 electrically connects the conductive member 30, connected to the device-side connecting portion 22, and the connector 50, connected to the external side connecting portion 24.

Each of the device-side connecting portions 22 of the group 21A of first conductive patterns and a respective one of device-side connecting portions 22 of the group 21B of second conductive patterns is included in a respective one of the first conductive pair 23a, the second conductive pair 23b, and the third conductive pair 23c. In FIG. 7, the first conductive pair 23a, the second conductive pair 23b, and the third conductive pair 23c are arranged in the order from the lower side to the upper side of the mounting substrate 20 in the plan view. The group 21A of first conductive patterns and the group 21B of second conductive patterns are symmetric about the longitudinal direction of the mounting substrate 20. In this arrangement, the group 21A of first conductive patterns included in the first conductive pair 23a to the third conductive pair 23c and the group 21B of second conductive patterns included in the first conductive pair 23a to the third conductive pair 23c are symmetrically formed on the right and left sides in the plan view.

In the example shown in FIG. 7, the areas of the conductive patterns 21 of the first conductive pair 23a are larger than each of the area of the conductive patterns 21 of the second conductive pair 23b and the area of the conductive patterns 21 of the third conductive pair 23c. The electric current supplied to an element electrically connected to the first conductive pair 23a is larger than the electric current supplied to an element electrically connected to the second conductive pair 23b, and is larger than the electric current supplied to an element electrically connected by the third conductive pair 23c. Increase of the area of the conductive patterns 21 of the first conductive pair 23a allows for improving heat dissipation performance, so that electric current larger than electric current supplied to the conductive patterns 21 of the second conductive pair 23b and electric current supplied to the conductive patterns 21 of the third conductive pair 23c can be supplied to the conductive patterns 21 of the first conductive pair 23a. Further, increase of the area of the conductive patterns 21 of the first conductive pair 23a for a large electric current allows for obtaining the effect of reducing the resistivity to reduce the Joule heat. In the light-emitting device 10, the first conductive pair 23a establishes the electrical connection of the light-emitting elements 14, and the second conductive pair 23b and the third conductive pair 23c establish the electrical connections of respective ones of the two state detecting members 17.

Each of the first conductive pair 23a, the second conductive pair 23b and the third conductive pair 23c of the group 21A of first conductive patterns is electrically connected to a respective one of the three first conductive regions 12A of the light-emitting device 10 by a respective one of the conductive members 30, as shown in the drawings such as FIG. 1 and FIG. 2. Similarly, each of the first conductive pair 23a, the second conductive pair 23b, and the third conductive pair 23c of the group 21B of second conductive patterns is electrically connected to a respective one of the three second conductive regions 12B of the light-emitting device 10 by a respective one of the conductive members 30. As for the group 21A of first conductive patterns, the conductive pattern 21 of the second conductive pair 23b passes outside the device-side connecting portion 22 of the conductive pattern 21 of the first conductive pair 23a, and the conductive pattern 21 of the third conductive pair 23c passes outside the device-side connecting portion 22 of the conductive pattern 21 of the second conductive pair 23b, as shown in the schematic plan view of FIG. 7. The same applies to the group 21B of second conductive patterns.

Figure 15:
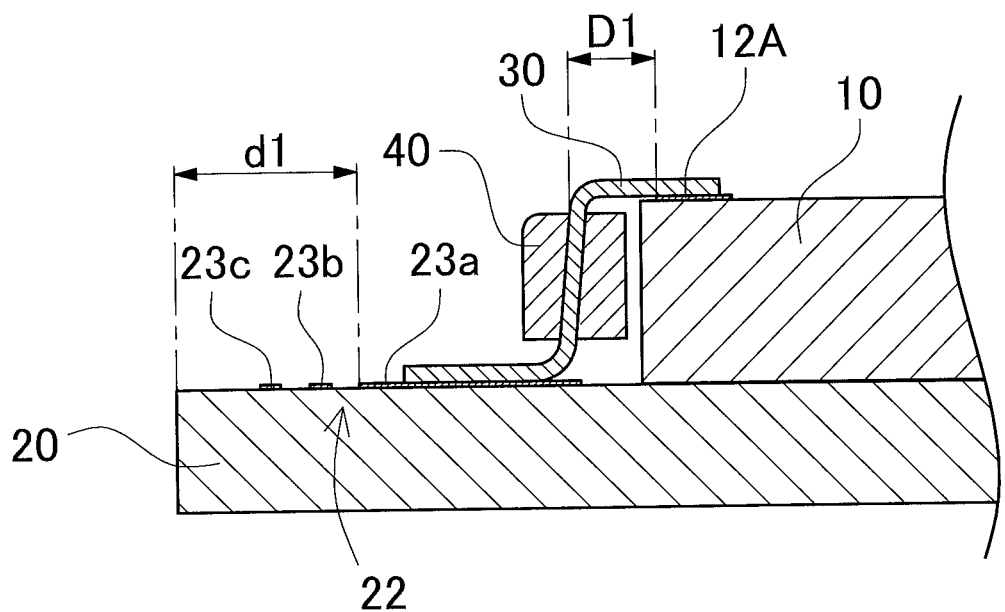
FIG. 15 is a schematic cross-sectional view of the light source module taken along the line XV-XV of FIG. 3.

FIG. 15 shows a schematic cross-sectional view of the light source module taken along the line XV-XV of FIG. 3 to show the mounting positions of the conductive members 30 and the light emitting device 10 on the mounting substrate 20. In such an arrangement, the conductive patterns 21 of the second conductive pair 23b and the third conductive pair 23c are required to be arranged in a gap d1 between the device-side connecting portion 22 of the first conductive pair 23a and a periphery of the mounting substrate 20 as shown in the schematic plan view of FIG. 7. In other words, the first conductive pair 23a is required to be arranged with a certain distance d1 inward from the periphery of the mounting substrate 20 to allow the other conductive patterns 21 to pass through as shown in FIG. 7 and FIG. 15. Accordingly, the first conductive pair 23a is close to the light-emitting device 10.

As described above, the conductive member 30 to be mounted on the first conductive pair 23a has the pressing structure in which the second end of the conductive member 30 is pressed against the first conductive region 12A. In the example shown in FIG. 15, the upper tip portion of the conductive member 30, which is a metal plate, is bent to elastically press the second connecting portion 32 against the first conductive region 12A. In such a structure, if the distance between the second connecting portion 32 and the first conductive region 12A is excessively small, it is difficult to secure a stroke for allowing the elasticity to be exhibited. On the other hand, the longer the distance between the light-emitting device 10 and the first conductive pair 23a is, the larger the width of the mounting substrate 20 becomes, so that the size of the light source module is increased. The positions of the device-side connecting portions 22 of the mounting substrate 20 are configured with such consideration.

Ninth Embodiment

Figure 16:
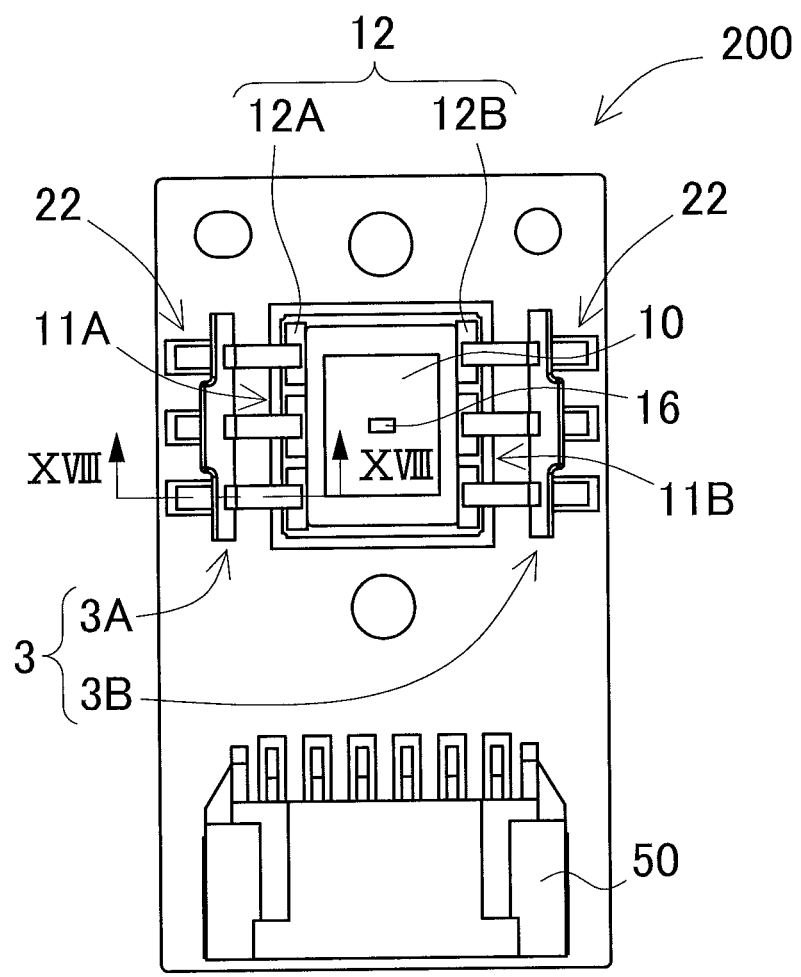
FIG. 16 is a schematic plan view of a light source module according to a ninth embodiment.
Figure 17:
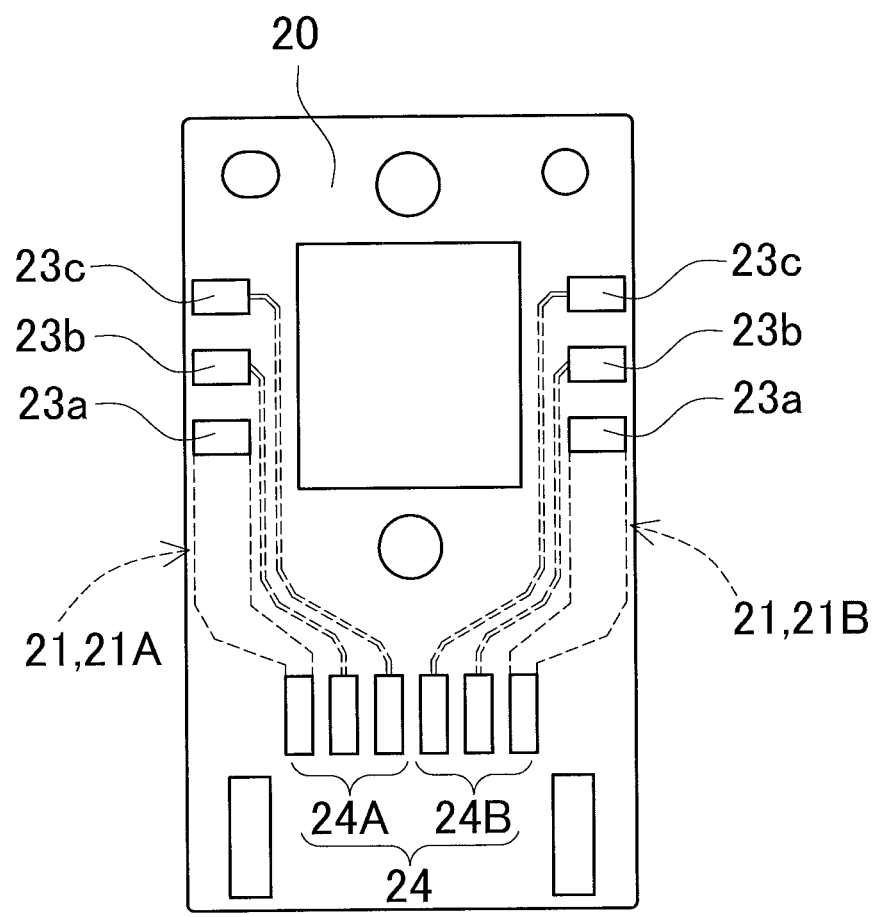
FIG. 17 is a schematic plan view of conductive patterns of a mounting substrate in FIG. 16.
Figure 18:
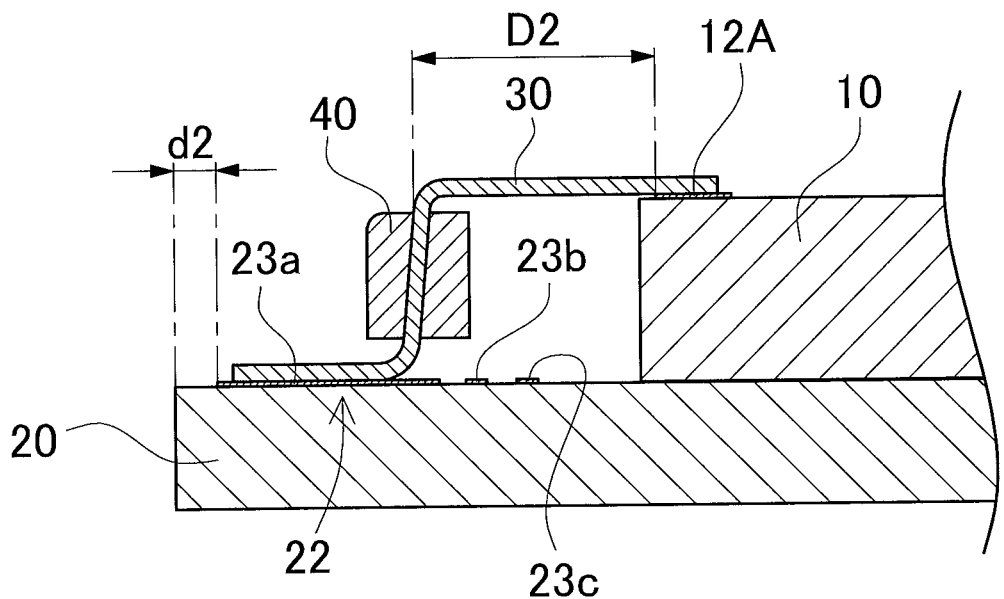
FIG. 18 is a schematic cross-sectional view of the light source module taken along the line XVIII-XVIII of FIG. 16.

FIG. 16 to FIG. 18 show a light source module according to a ninth embodiment in which the distance between the light-emitting device and the first conductive pair is secured to facilitate exhibition of the elasticity of the second connecting portion without changing the size of the mounting substrate. FIG. 16 is a schematic plan view of a light source module 200 according to the ninth embodiment, FIG. 17 is a schematic plan view of conductive patterns 21 of the mounting substrate 20, and FIG. 18 is a schematic cross-sectional view of the light source module taken along the line XVIII-XVIII of FIG. 16. Members similar to members described above in the first embodiment, etc., are indicated by the same reference numerals in these drawings, and their detailed descriptions are omitted. In the light source module 200 of the ninth embodiment, the device-side connecting portions 22 of the group 21A of first conductive patterns and the group 21B of second conductive patterns are arranged near the periphery of the mounting substrate 20 having a rectangular shape in a plan view as shown in the schematic plan views of FIG. 16 and FIG. 17. In each of the group 21A of first conductive patterns and the group 21B of second conductive patterns, the conductive pattern 21 of the second conductive pair 23b passes through a gap between the conductive pattern 21 of the first conductive pair 23a and the light-emitting device 10, and the conductive pattern 21 of the third conductive pair 23c passes through a gap between the conductive pattern 21 of the second conductive pair 23b and the light-emitting device 10. In each of the group 21A of first conductive patterns and the group 21B of second conductive patterns, the unexposed portions of the conductive pattern 21 of the second conductive pair 23b and the conductive pattern 21 of the third conductive pair 23c are located between the device-side connecting portion 22 of the conductive pattern 21 of the first conductive pair 23a and the light-emitting device 10, and the unexposed portion of the conductive pattern 21 of the third conductive pair 23c is located between the device-side connecting portion 22 of the conductive pattern 21 of the second conductive pair 23b and the light-emitting device 10. This arrangement allows the device-side connecting portion 22 to be disposed near the periphery of the mounting substrate 20 as shown in the schematic cross-sectional view of FIG. 18. That is, a distance d2 between the periphery of the mounting substrate 20 and the first conductive pair 23a can be reduced, so that a distance D2 between the first conductive region 12A and the first conductive pair 23a can be relatively increased. Accordingly, a length of the second connecting portion 32 of the conductive member 30 can be increased, so that a stroke of the second connecting portion 32 can be secured to facilitate exhibition of the elasticity. This can result in improvement in the reliability of the electrical connection between the conductive member 30 and the light-emitting device 10.

Further, the distance between each of the external side connecting portions 24 of the group 21A of first conductive patterns and a respective one of the external side connecting portions 24 of the group 21B of second conductive patterns is shorter than the distance between each of the device-side connecting portions 22 of the group 21A of first conductive patterns and a respective one of the device-side connecting portions 22 of the group 21B of second conductive patterns. This arrangement enables the external side connecting portions 24 to extend to a periphery of the mounting substrate 20 as shown in the schematic plan view of FIG. 17 while the right and left sides of the external side connecting portions 24 are unused spaces in the arrangement shown in the schematic plan view of FIG. 7, so that the conductive patterns 21 can have a great area effectively using the spaces. Accordingly, a greater electric current can be supplied, and increase in area of the conductive patterns 21 allows reduction in resistivity, so that the generated amount of the Joule heat can be reduced.

Such an arrangement in which the conductive members 30 are disposed over the device-side connecting portions 22 as described above allows for increasing the length of the second connecting portions 32 without increasing the size of the mounting substrate 20. This structure allows for surely exhibiting the elasticity of the second connecting portions 32 and increasing reliability of the electrical connections between the conductive members 30 and the light-emitting device 10.

Tenth Embodiment

Figure 19:
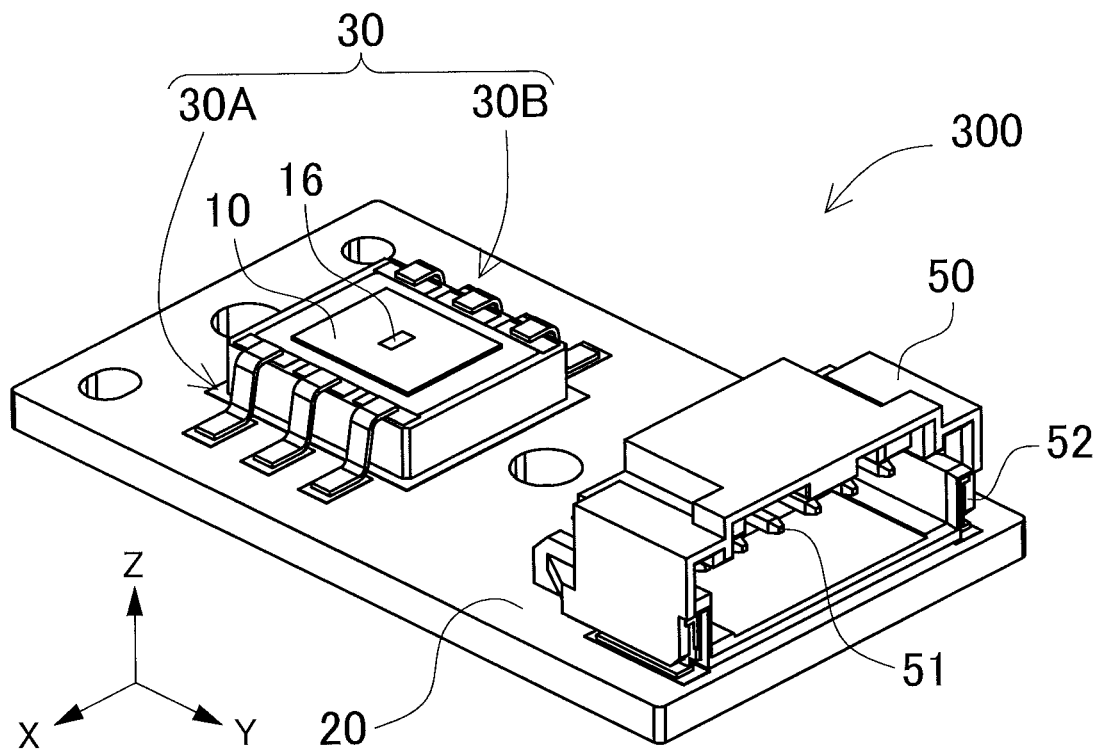
FIG. 19 is a schematic perspective view of a light source module according to a tenth embodiment.

In the embodiments described above, the structure in which the conductive member holder 40 holds a plurality of conductive members 30 has been described. FIG. 19 is a schematic perspective view of a light source module according to a tenth embodiment that does not include conductive member holders. In a light source module 300 shown in FIG. 19, members that are the same as members described above in the first embodiment are indicated by the same reference numerals, and their detailed descriptions can be omitted. Directly connecting the conductive members 30A and 30B to respective corresponding ones of the device-side connecting portions 22 of the mounting substrate 20 and respective corresponding ones of the conductive regions 12 of the light-emitting device 10 allows further reduction of the number of members and reduction of the weight.

Eleventh Embodiment

Figure 20:
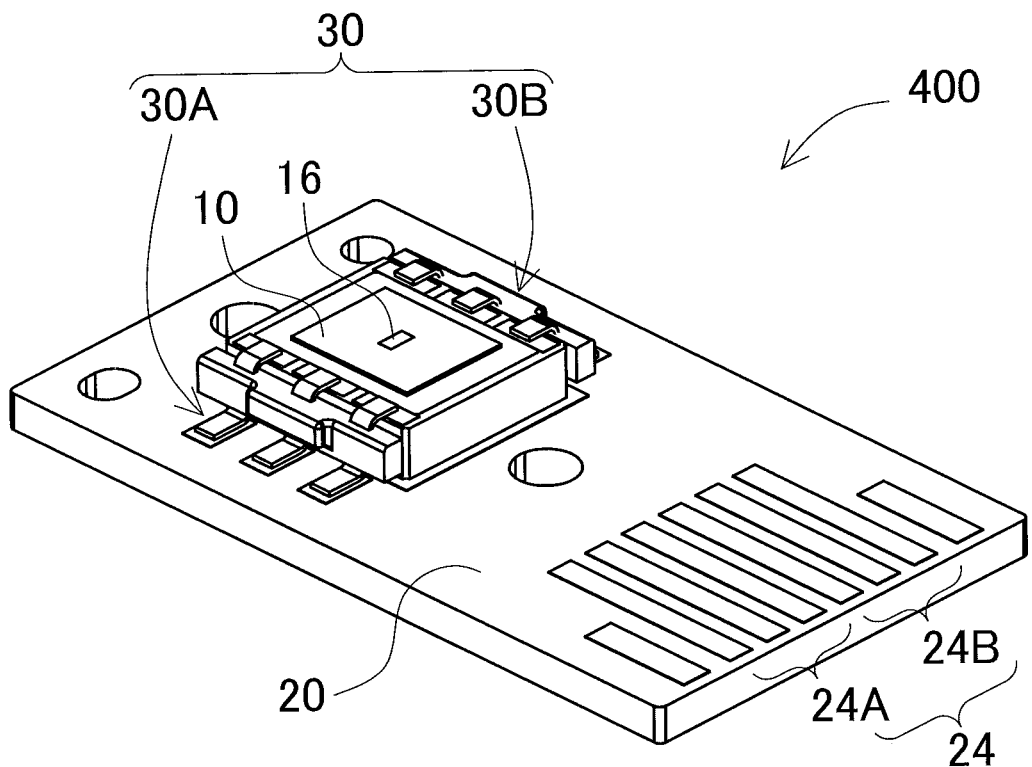
FIG. 20 is a schematic perspective view of a light source module according to an eleventh embodiment.

While the connector 50 is disposed on the mounting substrate 20 in the example shown in FIG. 1 and FIG. 2, the connector is not necessarily employed. For example, a terminal part used for connection to an external device can be formed on the mounting substrate, and a harness used for connection to an external device can be connected to the terminal part by soldering. An example of such structure is shown in FIG. 20, which is a schematic perspective view of a light source module according to an eleventh embodiment. In a light source module 400 shown in the drawing, members that are the same as members described above in the first embodiment are indicated by the same reference numerals, and their detailed descriptions can be omitted. The electrical connection to an external device can be maintained by directly connecting a harness or wires to the mounting substrate 20 as described above without disposing a separate member such as the connector.

The light source module according to certain embodiments can be used for, for example, a light source for a vehicle headlight, a light source for a projector, a lighting apparatus for a streetlight or a factory, a pilot lamp, or a backlight for a display.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:
1. A light source module comprising:
    a light-emitting device having an upper surface and a lower surface and comprising:
        at least one light-emitting element, and
        a plurality of conductive regions on the upper surface of the light-emitting device;
    a mounting substrate having an upper surface on which a lower surface side of the light-emitting device is located, the mounting substrate comprising a plurality of conductive patterns on the upper surface of the mounting substrate, each of the plurality of conductive patterns including a device-side connecting portion and an external side connecting portion; and
    a plurality of conductive members, each of the plurality of conductive members having:
        a first end bonded to a respective one of the device-side connecting portion, and
        a second end opposite to the first end, the second end being in contact with a respective one of the conductive regions by elasticity to electrically connect the respective one of the conductive regions and a respective one of the conductive patterns.
2. The light source module according to claim 1, further comprising a conductive member holder integrally holding two or more conductive members of the plurality of conductive members.
3. The light source module according to claim 2, wherein the conductive member holder includes:
    a first lateral surface facing the light-emitting device;
    a second lateral surface opposite to the first lateral surface; and a protrusion on the second lateral surface opposite to the first lateral surface.

4. The light source module according to claim 1,
wherein the plurality of conductive patterns comprise at least one first conductive pattern and at least one second conductive pattern,
wherein the light-emitting device has a first lateral surface and a second lateral surface opposite to the first lateral surface,
wherein the plurality of conductive regions comprise at least one first conductive region disposed at a first lateral surface side of the light-emitting device and at least one second conductive region disposed at a second lateral surface side of the light-emitting device, and
wherein the plurality of conductive members comprise:
at least one first conductive member facing the first lateral surface and electrically connecting a respective one of the at least one first conductive region and a respective one of the at least one first conductive pattern, and
at least one second conductive member facing the second lateral surface and electrically connecting a respective one of the at least one second conductive region and a respective one of the at least one second conductive pattern.

5. The light source module according to claim 4,
wherein the at least one first conductive member comprises a plurality of first conductive members,
wherein the at least one first conductive region comprises a plurality of first conductive regions,
wherein the at least one first conductive pattern comprises a plurality of first conductive patterns,
wherein each of the first conductive members electrically connects a respective one of the first conductive regions and a respective one of the first conductive patterns,
wherein the at least one second conductive member comprises a plurality of second conductive members,
wherein the at least one second conductive region comprises a plurality of second conductive regions,
wherein the at least one second conductive pattern comprises a plurality of second conductive patterns, and
wherein each of the second conductive members electrically connects a respective one of the second conductive regions and a respective one of the second conductive patterns.

6. The light source module according to claim 5,
wherein the plurality of first conductive patterns and the plurality of second conductive patterns constitute a plurality of conductive pairs each consisting of a respective one of the first conductive patterns and a respective one of the second conductive patterns,
wherein the plurality of conductive pairs comprise a first conductive pair and a second conductive pair, the second conductive pair including the device-side connecting portion farther from the external side connecting portion than the device-side connecting portion included in the first conductive pair,
wherein each of the first conductive patterns of the second conductive pair passes through a gap between a respective one of the first conductive patterns of the first conductive pair and the light-emitting device, and
wherein each of the second conductive patterns of the second conductive pair passes through a gap between a respective one of the second conductive patterns of the first conductive pair and the light-emitting device.

7. The light source module according to claim 6, wherein an area of the first and second conductive patterns of the first conductive pair is larger than an area of the first and second conductive patterns of the second conductive pair.

8. The light source module according to claim 1, further comprising a connector connected to the external side connecting portions of the conductive patterns.

9. The light source module according to claim 1, wherein the first end of each of the plurality of conductive members is fixed to the device-side connecting portion by soldering.

* * * * *